US006328847B1

United States Patent
Winters

(10) Patent No.: US 6,328,847 B1
(45) Date of Patent: *Dec. 11, 2001

(54) DOWNSTREAM PLASMA REACTOR SYSTEM INCORPORATING A PLASMA-RESISTANT BLOCKING MEMBER

(75) Inventor: Toby J. Winters, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/487,535

(22) Filed: Jan. 19, 2000

(51) Int. Cl.[7] ........................................ C23F 1/02
(52) U.S. Cl. ............................... 156/345; 118/733
(58) Field of Search ........................ 118/715, 333, 118/723 ME, 723 ER, 723 IR; 156/345

(56) References Cited

U.S. PATENT DOCUMENTS

| 5,082,517 | * | 1/1992 | Moslehi .................... 156/345 |
| 5,228,052 | | 7/1993 | Kikuchi et al. . |
| 5,443,686 | | 8/1995 | Jones et al. . |
| 5,560,803 | | 10/1996 | Mihara et al. . |
| 5,722,668 | | 3/1998 | Rice et al. . |
| 5,747,917 | * | 5/1998 | Herchen .................... 313/231.31 |
| 5,795,831 | | 8/1998 | Nakayama et al. . |
| 6,165,313 | * | 12/2000 | Winters et al. ............... 156/345 |

OTHER PUBLICATIONS

The Fab Line—Back Issues from the Oct. 27, 1997 Issue of Electronic News, Electronic News Online (6 pages).*
4 pgs. of information on TFE–O–SIL® O–Rings downloaded from www.row–inc.com on Jun. 10, 1999.

* cited by examiner

Primary Examiner—Gregory Mills
Assistant Examiner—Luz Alejandro
(74) Attorney, Agent, or Firm—Kevin L. Daffer; Conley, Rose & Tayon P.C.

(57) ABSTRACT

A downstream plasma reactor system incorporating a plasma-resistant blocking member is presented. In an embodiment, the system preferably includes a sealing member and a plasma-resistant blocking member. The sealing member may be arranged between a plasma tube and an inlet conduit configured to be in gaseous communication with a reaction chamber. The blocking member preferably extends from a discharge opening of the plasma tube into the inlet conduit to inhibit plasma exiting the discharge opening from passing the blocking member to contact the sealing member. Being so configured, the downstream plasma reactor system may have an improved mean time between failure of the seal between the plasma tube and the inlet chamber without compromising seal effectiveness.

17 Claims, 7 Drawing Sheets

DOWNSTREAM PLASMA REACTOR SYSTEM INCORPORATING A PLASMA-RESISTANT BLOCKING MEMBER

BACKGROUND OF THE INVENTION

1. Field of the Invention

This invention relates to plasma processing equipment and, more particularly, to downstream plasma reactor systems usable in semiconductor processing.

2. Description of the Related Art

The information described below is not admitted to be prior art by virtue of its inclusion in this Background section.

Plasma processing is commonly used in semiconductor fabrication. One use for plasma processing is in the removal of layers formed on a substrate, typically by etching some or all of a particular layer. Plasma processing is often performed in single chamber reactor systems in which plasma is generated exclusively in the chamber in which processing is carried out. Alternatively, downstream plasma reactor systems may be used that first convert gases into plasma in a plasma tube and then transport the plasma-generated reactive species downstream into the reaction chamber. These reactor systems can be used to avoid the radiation damage and resist hardening common in single chamber plasma reactor systems. And like single chamber plasma reactor systems, downstream plasma reactor systems can be used to create reactive species capable of etching layers of silicon dioxide, silicon nitride, aluminum, and various other materials commonly used in semiconductor fabrication.

A common application for downstream plasma reactor systems is resist stripping, i.e., the removal of patterned photoresist after completion of an etch step. Resist stripping usually is carried out in an ashing process in which the resist is oxidized to a gaseous form and removed from the reaction chamber. Those downstream plasma reactor systems that are specifically configured for resist stripping are often labeled downstream plasma strippers.

FIG. 1 presents a schematic view of an exemplary downstream plasma reactor system 100, the GaSonics L3500, which is commercially available from GaSonics International (San Jose, Calif.). Because it is primarily configured to remove resist, downstream plasma reactor system 100 may be properly labeled a downstream plasma stripper. Reactor system 100 includes a plasma tube 104. Plasma tube 104 is made up of an intake portion 106, a central portion 108, and a discharge portion 110. Gas source 102 is configured to be in gaseous communication with (i.e., may be operably connected such that gases can flow therebetween) intake portion 106. Plasma tube 104 is coupled to inlet conduit 112. Inlet conduit 112 is connected to reaction chamber 114. Reactor system 100 also includes plasma generating apparatus 111, which is positioned adjacent to plasma tube central portion 108 and includes a power supply and a microwave generator. Outlet conduit 116 is connected to reaction chamber 114 and is configured to be in selective gaseous communication with vacuum pump 118.

During operation of downstream plasma reactor system 100, vacuum pump 118 may be used to evacuate gases from reaction chamber 114 and all conduits in gaseous communication with reaction chamber 114, including inlet conduit 112 and plasma tube 104. Gases may be introduced into plasma tube 104 from gas source 102 via intake portion 106. The desired amounts and proportions of gases supplied by gas source 102 may be regulated using one or more mass flow controllers. These gases are typically selected such that the reactive species generated upon plasma formation are appropriate for the particular process being performed. As the gases enter central portion 108, microwaves created by plasma generating apparatus 111 convert at least a portion of the entering gases into plasma (i.e., creating a partially ionized plasma). The plasma generated in central portion 108 subsequently passes into discharge portion 110. From discharge portion 110, the plasma is conveyed into inlet conduit 112. The plasma is then transported through inlet conduit 112 into reaction chamber 114 to be used in processing.

FIG. 2 presents an expanded cross-sectional view of section A of reactor system 100. Section A includes parts of discharge portion 110 of plasma tube 104 and coupling portion 126 of inlet conduit 112. As shown in FIG. 2, discharge portion 110 may be subdivided into an initial section 120, an expanded section 122, and a tube extension 124. As shown in FIG. 2, tube extension 124 is a tube positioned partially within and extending beyond initial section 120 and expanded section 122. Initial section 120, expanded section 122, and tube extension 124 are composed of fused quartz, and tube extension 124 is fixably attached (i.e., coupled such that it is not capable of significant independent movement) to initial section 120 at glass weld 123. Discharge opening 125 is defined at the end of tube extension 124. Sealing o-ring groove 128 is defined within expanded section 122 and is configured to hold sealing o-ring 130. Sealing o-ring 130 is composed of an elastomeric material. Being composed an elastomeric material, sealing o-ring 130 is able to conform to the surfaces of plasma tube 104 and inlet conduit 112 to achieve good sealing action. Sealing o-ring 130 should be configured to make a seal between plasma tube 104 and inlet conduit 112 sufficient to maintain the level of vacuum desired within the plasma tube and inlet conduit. Coupling section 126 includes socket 131 and throat 133. Socket 131 is configured to fit snugly around expanded section 122 when sealing o-ring 130 is in place.

Sealing o-ring 130 should not only provide a good seal between plasma tube 104 and inlet conduit 112, but should also be able to maintain such a seal over numerous operation cycles carried out over a sizable time period. One factor that determines the life of a seal over repeated operational cycles is whether the seal posses sufficient resiliency. Sufficient resiliency in sealing o-ring 130 is important because when reactor system 100 is under vacuum during an operation cycle, coupling portion 126 exerts substantial lateral (i.e. radial) force on the sealing o-ring, compressing it. Then when then the cycle is completed, vacuum is released and the lateral force exerted by coupling section 126 subsides. A sufficiently resilient sealing o-ring 130 is able to be significantly compressed during a vacuum cycle and then return to its original shape after completion of the cycle. As such, a sufficiently resilient sealing o-ring may maintain high seal quality over numerous operation cycles.

With time, repeated compression and expansion can cause even the most resilient of o-rings to fail; however, it is desired that the mean time between failures of a sealing o-ring be extended as long as is reasonably possible. For example, replacing sealing o-ring 130 requires the purchase of a new o-ring and necessitates the expenditure of limited employee time. Over time, the reduction in the throughput of reactor system 100 during these replacement periods can result in a substantial loss of production value. It is thus beneficial to reduce the frequency with which replacement of sealing o-ring 130 is required (i.e., to extend the mean time between failure for the o-ring).

Unfortunately, the operating conditions of reactor system 100 can greatly reduce the amount of time between failures of sealing o-ring 130. One explanation for this outcome is the presence of numerous reactive species (e.g., ions and radicals) in the plasma exiting the plasma tube. Most of these reactive species will pass directly into the inlet conduit, but some end up in contact with sealing o-ring 130. While these plasma-generated reactive species do not substantially erode the fused quartz of which plasma tube 104 is constructed, other elements of the plasma system, such as sealing o-ring 130, arc often constructed of materials more susceptible to such erosion. Furthermore, resist stripping often incorporates hydrogen- and oxygen-containing plasmas that have a particularly pronounced ability to degrade many commonly used sealing materials. As such, the chemical resistance of sealing o-ring 130 to plasma-generated radicals can greatly influence the average time between failure of such an o-ring.

This problem may be partially resolved by the use of a tube extension 124 such as is shown in FIG. 2. One purpose of tube extension 124 is to provide a clean flow of plasma from discharge opening 10 into throat 133. In other words, tube extension 124 serves to increase the length that the plasma travels beyond sealing o-ring 130 so that less of the plasma will be able to double back and attack the o-ring. But since tube extension 124 is composed of fused quartz it is relatively inflexible (e.g., it cannot undergo substantial bending without breaking and/or cracking), and as such cannot adequately seal throat 133 of coupling section 126. Consequently, a large number of plasma-generated reactive species are still able to reach sealing 130. The reactive species can quickly erode non-chemically resistant sealing o-rings, making such o-rings almost unusable as sealing o-ring 130.

In an attempt to overcome such difficulties, numerous chemically resistant elastomers have been used as materials for sealing o-ring 130. One of these is Viton®, a fluoroelastomer commercially available from DuPont Dow Elastomers, Wilmington, Del. Viton® has good resiliency, and is suitable for use in vacuum operations. But while Viton® and similar fluoroelastomers possess some chemical resistivity, they generally are still relatively susceptible to erosion by plasma-generated reactive species. Over time, the constant attack of these reactive species can break off portions of sealing o-ring 130. These portions may then be swept into reaction chamber 114 where they can cause damage serious enough to prevent the formation of functioning integrated circuits. Eventually, plasma-generated reactive species can even erode enough of sealing o-ring 130 to cause its complete failure. When used as sealing o-ring 130 in reactor system 100, such o-rings often fail in less than three days—an undesirably short time.

Increased success has been obtained using materials such as Kalrez® (a perfluoroelastomer commercially available from DuPont Dow elastomers) and Chemraz® (a perfluoroelastomer commercially available from Green, Tweed & Co, Kulpsville, Pa.). Because of the enhanced chemical resistivity of these materials, a sealing o-ring made of such perfluoroelastomer typically lasts longer than one made of a fluoroelastomer like Viton®. These materials are more expensive than Viton®, however, and still often fail in less than a week of operation.

One type of o-ring that has been able to significantly increase the time before erosion-induced failure of sealing o-ring 130 is an o-ring encapsulated with Teflon® (a highly chemically resistant fluorocarbon polymer commercially available from E.I. du Pont de Nemours and Company). Teflon®-encapsulated o-rings typically include a Teflon® jacket that surrounds an elastomer core. These o-rings are substantially more resistant to erosion by plasma-generated reactive species than the elastomeric materials mentioned above, and thus may withstand the attack of plasma-generated reactive species for a significantly longer time.

Unfortunately, Teflon®-encapsulated o-rings are not well suited for use as sealing o-ring 130. For one, the Teflon® jacket of these o-rings makes these o-rings less resilient than many elastomeric o-rings. The inflexibility of Teflon®-encapsulated o-rings compared to o-rings composed of elastomeric materials can increase the difficulty of coupling plasma tube 104 and inlet conduit 112. And because of the relative lack of resiliency in the Teflon® jacket, a Teflon®-encapsulated o-ring may not be able to fully return to its original shape after being compressed during an operation cycle. Thus, a Teflon®-encapsulated sealing o-ring may become substantially deformed over numerous compression and expansion cycles. The discrepancy between the sealing o-ring's original shape and its deformed shape can significantly reduce the sealing ability of the o-ring. Eventually, a Teflon®-encapsulated sealing o-ring 130 may become so deformed that it can no longer provide the necessary sealing level. Even worse, the buildup of microstresses in the Teflon® jacket of the o-ring can cause the o-ring jacket to crack, potentially creating an immediate and unexpected loss of vacuum.

Furthermore, tube extension 124 of plasma tube 104 is undesirably susceptible to breakage, thus further reducing the mean time between failure reactor system 100. As noted above, tube extension 124 of plasma tube 104 is fixably attached to initial portion 120, and thus is incapable of significant independent movement. In addition, when the plasma tube is coupled to inlet conduit 112, tube extension 124 extends relatively far into throat 133 (to provide a clean path for the plasma). The position of tube extension 124 within throat 133 when the plasma tube and inlet conduit are coupled may be such that even slight movement of the inlet conduit relative to the plasma tube can cause coupling portion 126 to exert a large amount of stress on tube extension 124, particularly around glass weld 123. Unfortunately, such movement often occurs during coupling and decoupling of the plasma tube and inlet conduit at a level sufficient to cause the tube extension to break off from the rest of plasma tube 104. Such breakage typically occurs at or near welds 123.

Breakage of tube extension 124 may be highly disadvantageous for several reasons. For one, when tube extension 124 breaks plasma tube 104 typically is rendered unusable, so the entire plasma tube must be replaced. As might be expected, replacement of the entire plasma tube can be expensive, and can cost significantly more than the replacement of just one sealing o-ring. Further, reactor system 100 must be taken down for at least the time required to remove plasma tube 104, and in the case where a spare plasma tube is not immediately available, until a suitable replacement can be acquired or the broken plasma tube can be repaired. The processing time lost under these circumstances can significantly reduce reactor throughput—and thus overall process profitability.

Therefore, it would be desirable to develop a downstream plasma reactor system with an improved plasma tube sealing configuration. The desired reactor system should significantly extend the mean time between failure of a seal between the plasma tube and an inlet conduit to a reaction chamber. In addition, the desired system should have a plasma tube that is more durable, and in particular one that is less susceptible to breakage around its discharge opening. The improved sealing configuration should be one that can be incorporated without significantly increasing the difficulty of coupling the plasma tube to an inlet conduit or reducing the seal quality therebetween.

SUMMARY

The problems discussed above are in large part resolved by the present downstream plasma reactor system, apparatus for inhibiting plasma-induced erosion of a sealing member arranged between a plasma tube and a conduit, and method for operating a downstream plasma reactor system incorporating a plasma-resistant blocking member. In an embodiment, the downstream plasma reactor system preferably includes a sealing member and a plasma-resistant blocking member. The sealing member may be arranged between a plasma tube and an inlet conduit configured to be in gaseous communication with a reaction chamber. The blocking member preferably extends from a discharge opening of the plasma tube into the inlet conduit to inhibit plasma exiting the discharge opening from passing the blocking member to contact the sealing member. Being so configured, the downstream plasma reactor system may have an improved mean time between failure of the seal between the plasma tube and the inlet chamber without compromising seal effectiveness.

The blocking member preferably provides a continuous path for plasma from the plasma tube into the inlet conduit. In other words, the blocking member may serve as a plasma-resistant seal between the plasma tube and the inlet conduit such that plasma passing between the two elements is inhibited, and preferably substantially prevented, from reaching the sealing member. As such, the tendency of a sealing member to be eroded by plasma-generated reactive species may be greatly reduced. And since the mean time between failure of the sealing member may be reduced because of the reduced degree of erosion of the sealing member, the throughput of the reactor system can be significantly increased. In an embodiment, a plasma tube/inlet conduit sealing configuration (i.e., the elements used to seal the plasma tube and inlet conduit) in the present downstream plasma reactor system may have a mean time between failure of the sealing member that is at least three times a great as the mean time between failure of a Teflon-encapsulated sealing o-ring used as discussed above.

The blocking member is preferably plasma-resistant; that is, it is preferably capable of withstanding direct exposure to plasma-generated reactive species without significant erosion for a substantial time (e.g., greater than a few hours when used in a downstream plasma stripper such as described herein). While the blocking member is preferably composed of a material that is at least plasma-resistant (e.g., has some significant resistivity to attack by plasma-generated reactive species), it is not required to be composed of a material that is totally unaffected by plasma (e.g., one that is chemically inert). Preferably, the blocking member is at least partially composed of a fluorocarbon polymer. More preferably, the blocking member is at least partially composed of one of the fluorocarbon polymers available under the trademark Teflon and commercially available from E.I. du Pont de Nemours and Company (or a material having similar properties, e.g., resistance to attack by plasma-generated reactive species). Exemplary fluorocarbon polymers include perfluoroalkoxy polymer, fluorinated ethylene propylene polymer, and polytetrafluoroethylene.

Furthermore, the use of the plasma-resistant blocking member preferably allows for the incorporation of cheaper, more resilient materials for the sealing member. Because the composition and position of the blocking member reduces the exposure of the sealing member to plasma-generated reactive species, the chemical resistivity to such species of the material used for sealing member is less important than in many conventional designs. Consequently, the sealing member may be composed of cheaper, and possibly more resilient, elastomers having reduced chemical resistances without sacrificing sealing performance or decreasing mean time between seal failure. The sealing member is preferably a seal such as a sealing o-ring.

The present reactor system also may provide for the coupling and decoupling of a plasma tube with a reduced chance of breakage. As noted above, a disadvantage of using a conventional fixably attached tube extension to provide a clean path for plasma between a plasma tube and an inlet conduit is, among other things, that the tube extension is not able to significantly move independently of the inlet conduit without breaking. The present blocking member, however, is preferably not fixably attached to the plasma tube or inlet conduit. That is, the blocking member is preferably able to rotate, slide, and otherwise move independently of the plasma tube and inlet conduit (unless the inlet conduit and plasma tube arc coupled so tightly together that the movement of blocking member is restricted by the nature of the coupling). Such a blocking member may be referred to as a "floating" seal. Being so configured, the present blocking member may allow for more movement of the inlet conduit relative to the plasma tube without concern for breaking a portion of the reactor system. Thus, coupling/decoupling of a plasma tube and an inlet conduit may be significantly facilitated and simplified.

Although the present blocking member may preferably be used indefinitely, the blocking member may fail after numerous repeated uses. For example, the blocking member may break, or be eroded away by plasma to a point where it is no longer sufficiently effective. The present blocking member, though, is designed to facilitate its replacement and/or repair in case of such failure. Because blocking member is preferably not fixedly attached to the plasma tube or inlet conduit, if it does break it preferably will not require the replacement of the entire plasma tube, but only the blocking member itself. In addition, the blocking member can preferably be removed from the plasma tube very easily—much easier than, e.g., an o-ring securely arranged within a gland.

In addition, the plasma tube itself is preferably open-ended, and thus more durable than conventional designs. That is, the discharge portion of the plasma tube preferably terminates at an expanded portion in which a gland for the sealing member is arranged (e.g., a ball joint). Lacking a fixably attached extension such as tube extension 124, such a plasma tube may be more durable than conventional plasma tubes, and thus may allow for a greater degree movement freedom when coupling the plasma tube to the inlet conduit. In addition, an open-end plasma tube may facilitate the insertion and positioning of the blocking member within the discharge opening of the plasma tube.

To inhibit the passage of plasma as mentioned above, a portion of the blocking member is preferably adjacent to a portion of the conduit that has an inner diameter at most approximately equal to an outer diameter of the portion of the conduit. More preferably, the blocking member may contact an inner surface of the conduit when the conduit is coupled to the plasma tube. Contact between the blocking member and the inner surface of the conduit preferably reduces the ability of plasma to pass between the blocking member and conduit. Preferably, the blocking member has ribs (e.g., fins) that contact an inner surface of the inlet conduit. In an embodiment in which an inner diameter of the inlet conduit is less than the outer diameter of the ribs, the ribs may be flexible enough so they are bent by the inlet conduit. The ribs are preferably configured such that the flow of plasma between the ribs and an adjacent portion of the inlet conduit is inhibited, or even substantially prevented. Additionally, a portion of the plasma tube proximate to the discharge opening may have an inner diameter less than the outer diameter of the ribs in an embodiment. Consequently, when the blocking member is inserted into the discharge opening of the plasma tube, the ribs placed inside the plasma tube may be contacted by the narrower inner surface of the plasma tube and bent. Such bending of the ribs within the plasma tube may result in the flow of plasma between the ribs and an adjacent portion of the plasma tube being inhibited, or even substantially prevented as well.

In a preferred embodiment, the blocking member includes a polymeric sleeve arranged around a substantially chemically inert barrel. Ribs preferably extend from the body of the sleeve. The sleeve may be inserted into the discharge opening of the plasma tube. Accordingly, the sleeve preferably also includes a stop extending from the body of the sleeve further than the ribs. The stop may be configured to inhibit, and preferably to prevent, the blocking member from being inserted entirely into the plasma tube. The polymeric sleeve may be composed of a variety of plasma-resistant polymers, such as the fluorocarbon polymers described above.

The barrel is preferably composed of a substantially chemically inert material, such as fused quartz. Consequently, the barrel may withstand direct exposure to plasma for a substantial time without fear of erosion. The barrel preferably includes a central portion extending between a pair of flared ends. The flared ends preferably have an outer diameter greater than the inner diameter of the polymeric sleeve. The flared ends may serve to retain the sleeve upon and around the barrel during use, as well as to protect the ends of the sleeve from plasma-induced erosion.

It was noted above that some of the disadvantages of using Teflon®-encapsulated o-rings as sealing o-rings were that such o-rings could hinder coupling of the plasma tube with the inlet conduit and were susceptible to deformation over repeated operation cycles. A blocking member as described herein, however, preferably avoids these disadvantages. For instance, the blocking member may be situated between the plasma tube and the inlet conduit in a manner that allows the coupling section of the inlet conduit to slide over the blocking member during the coupling process. Furthermore, the majority of the lateral forces applied during coupling of the plasma tube with the inlet conduit and during compression by the coupling section during a vacuum cycle preferably fall on the sealing member, which may be composed of a more resilient material than the blocking member and is thus better suited to receive such forces.

Furthermore, the sealing member and the blocking member may both be in contact with the coupling section of the inlet conduit during operation. Consequently, both the blocking member and the sealing member may provide a seal between the plasma tube and the inlet conduit. It is preferred, however, that the seal provided by the sealing member be substantially tighter than the seal provided by the blocking member. Such an arrangement can extend the lifetime of the potentially less flexible materials that may be used in the sleeve of the blocking member.

A method for configuring a downstream plasma reactor system is also presented. The method may include providing a plasma tube, the plasma tube preferably including a discharge portion. A discharge opening may be defined in the end of the discharge portion of the plasma tube; the discharge opening is preferably defined in an expanded section (e.g., a ball joint) that is the terminal section of the discharge portion. A sealing member may be positioned on the plasma tube. A plasma-resistant blocking member may then be positioned between the plasma tube and an inlet conduit to a reaction chamber of the system. The plasma tube may then be coupled with an inlet conduit to a reaction chamber. Preferably, the blocking member extends from the discharge opening axially (e.g., in the direction of the long axis of the plasma tube) into the inlet conduit to inhibit plasma exiting the discharge opening from passing the blocking member to contact the sealing member during operation.

A method for operating a plasma system is also presented. The method may include transporting plasma from a plasma tube to an inlet conduit in gaseous communication with a reaction chamber. The system preferably includes a sealing member arranged between a plasma tube and the inlet conduit and a plasma-resistant blocking member extending from a discharge opening of the plasma tube into the inlet conduit. The method may also include inhibiting the plasma with the blocking member from passing the blocking member to contact the sealing member concurrent with transporting plasma from the plasma tube to the inlet conduit. Plasma may be generated in the plasma tube prior to transporting plasma from the plasma tube to the inlet conduit. Plasma may be subsequently transported from the inlet conduit into the reaction chamber.

More specifically, the method preferably involves forwarding the sealing member proximate the discharge opening of the plasma tube against a coupling section of an inlet conduit to compress the sealing member against the coupling section while concurrently drawing the blocking member within the inlet conduit. The inlet conduit is preferably connected to a reaction chamber. The step of forwarding the sealing member may involve applying vacuum pressure within the inlet conduit for drawing the sealing member against the coupling section. Vacuum pressure may be applied by use of a vacuum pump in selective gaseous communication with the reaction chamber connected to the inlet conduit. The step of drawing a blocking member within the inlet conduit preferably involves positioning the blocking member between and within the plasma tube and the inlet conduit in a gas sealing arrangement. The positioning of the blocking member in a gas sealing arrangement preferably entails forwarding the blocking member further into the inlet conduit than said sealing member.

BRIEF DESCRIPTION OF THE DRAWINGS

Other objects and advantages of the invention will become apparent upon reading the following detailed description and upon reference to the accompanying drawings in which.

Figure 1:
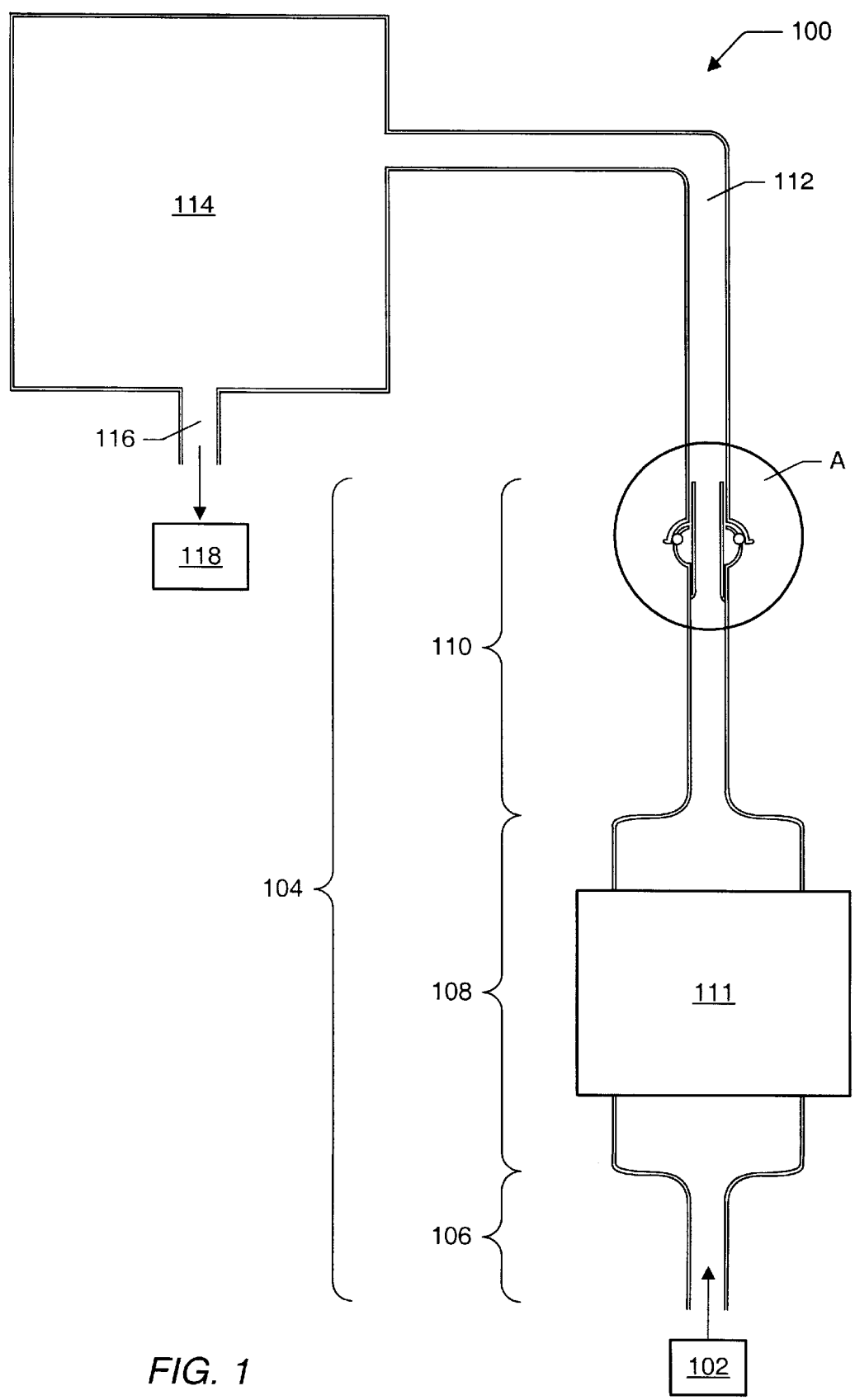
FIG. 1 is a schematic view of a conventional downstream plasma reactor system.
Figure 2:
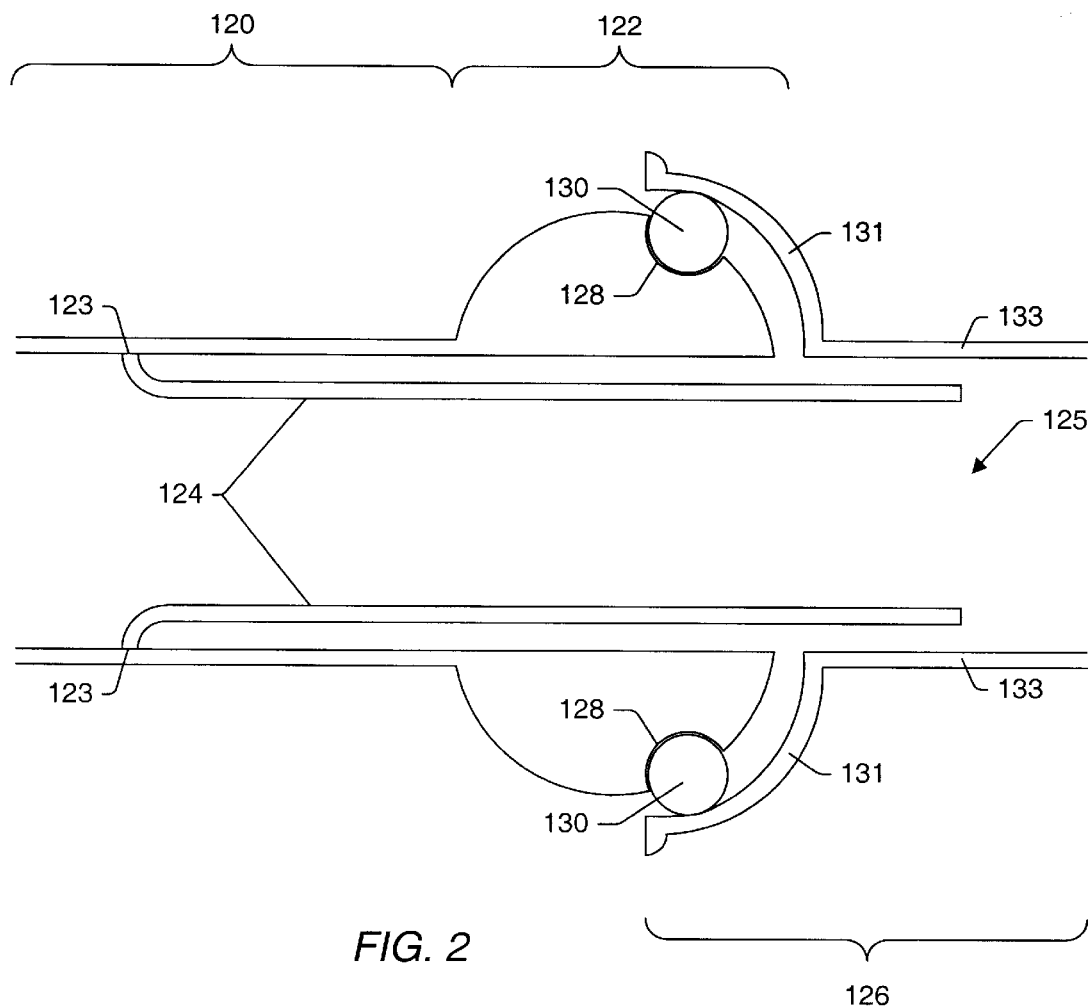
FIG. 2 is an enlarged cross-sectional view of section A of the reactor system depicted in FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 3:
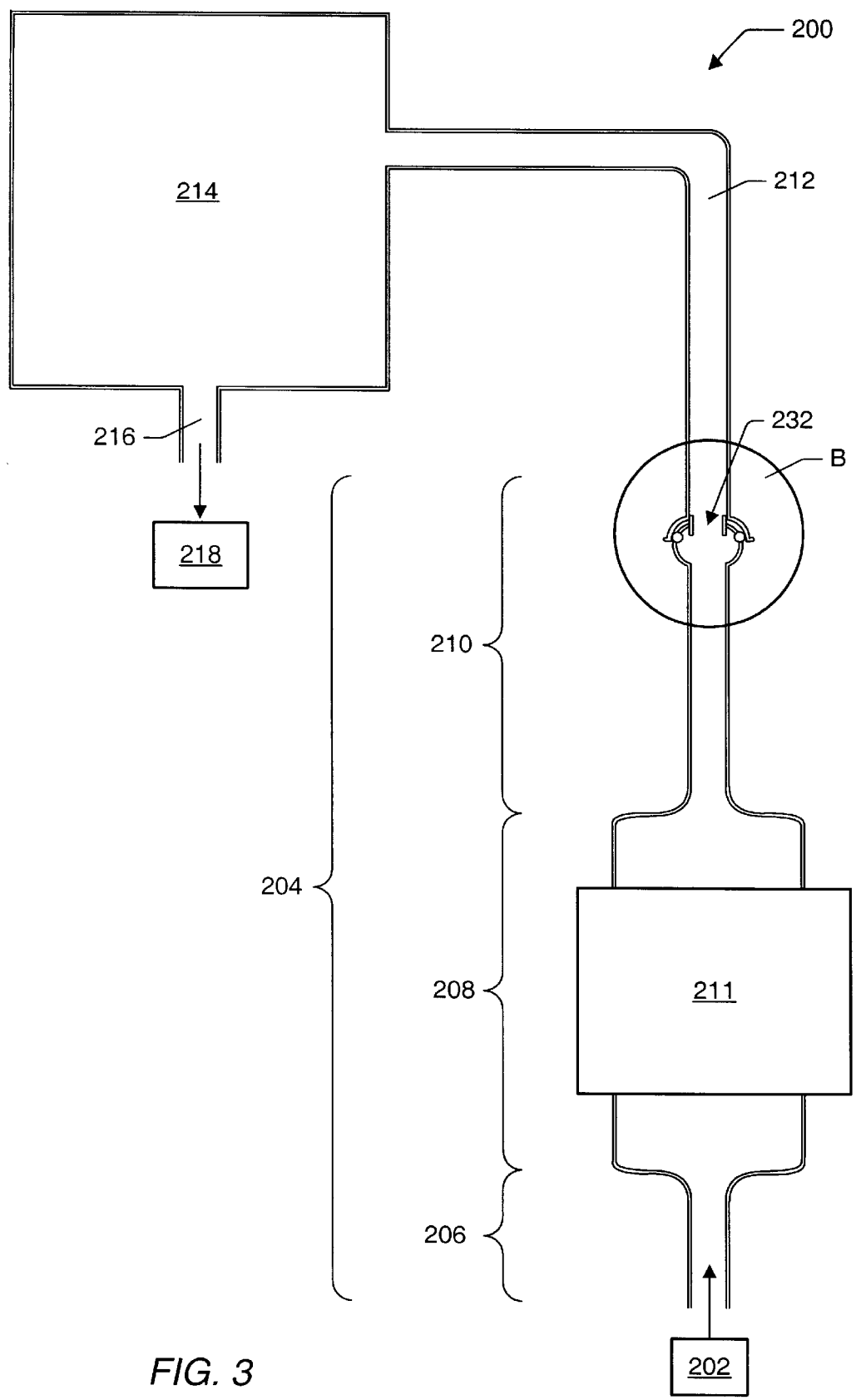
FIG. 3 is a schematic view of an improved downstream plasma reactor system in accordance with an embodiment.

An embodiment of an improved downstream plasma reactor system is depicted in FIG. 3. Downstream plasma reactor system 200 may be understood to represent an improved version of the GaSonics L3500 downstream plasma stripper, schematically described above as reactor system. Alternately, downstream plasma reactor system 200 may be considered to represent other similarly configured reactor systems. Reactor system 200 preferably includes a plasma tube 204 in which plasma may be formed during operation. Plasma tube 204 may include an intake portion 206, a central portion 208, and a discharge portion 210. Gas source 202 may be selectively configured to be in gaseous communication with intake portion 206 of the plasma tube. Plasma tube 204 may be connected to reactor chamber 214 through a coupling arrangement with inlet conduit 212. Blocking member 232 is preferably interposed between plasma tube 204 and inlet conduit 212. Inlet conduit 212 may be either directly or indirectly connected to reaction chamber 214 (that is, inlet conduit 212 may be coupled directly to the reaction chamber, or it may be coupled to one or more conduits that collectively form a flow path to the reaction chamber). Plasma generating apparatus 211 is preferably positioned adjacent to plasma tube central portion 208. Plasma generating apparatus 211 is preferably capable of generating an electric field sufficient to convert a portion of the gases entering the plasma tube into plasma, and in an embodiment may include a microwave generating apparatus coupled to a power supply (e.g., an RF power supply).

Plasma tube 204 may be constructed of a variety of materials compatible with plasma formation and containment, but is preferably composed of fused quartz. In an embodiment, the plasma tube preferably has a length of about 16 inches, and more preferably has a length of about 16.12 inches. Intake portion 206 preferably has a length of about 2 inches. The diameter of intake portion 206 is preferably about 15–18 mm. Intake portion 206 may include a coupling section, preferably having a size 28/15 socket, for mating with another pipe (e.g., by placing the socket around a ball joint of the other pipe). Central portion 208 preferably has a length of about 8 inches, and more preferably has a length of about 8.25 inches. The diameter of central portion 208 is preferably about 73–77 mm. Discharge portion 210 preferably has a length greater than that of intake portion 206; in an embodiment, discharge portion 210 has a length of about 6 inches, and more preferably has a length of about 5.87 inches. Even though expanded section 222 may have a greater outer diameter than initial section 220, discharge portion 210, including expanded section 222 and discharge portion 210, preferably has a substantially constant diameter throughout.

Figure 4:
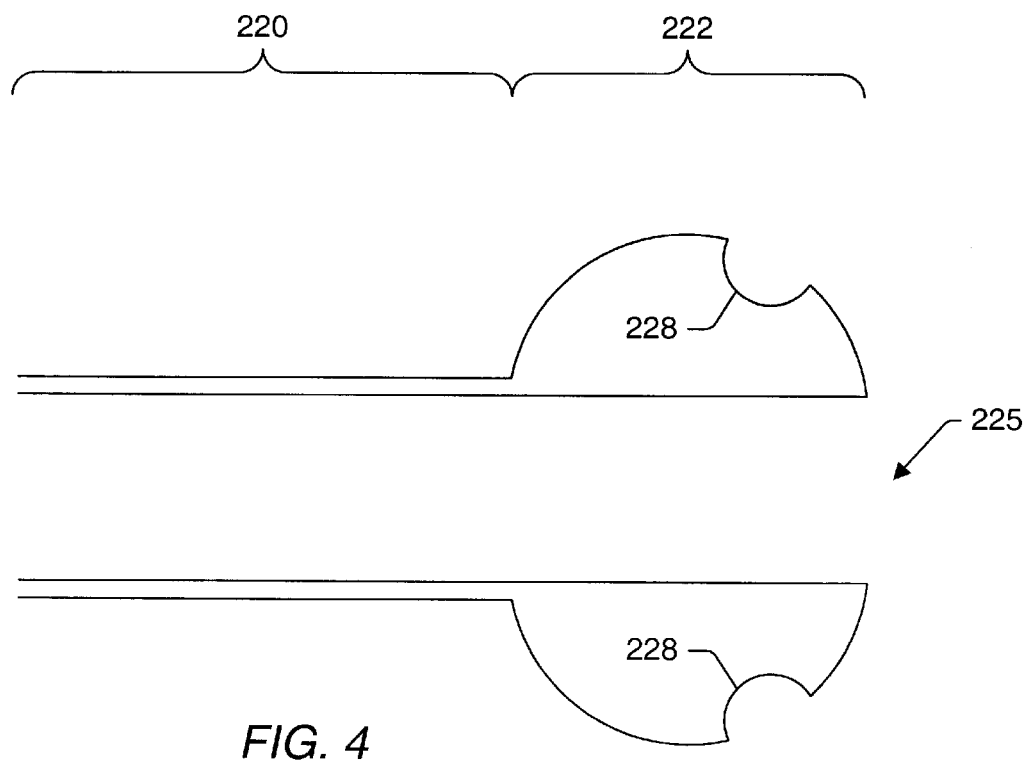
FIG. 4 is a enlarged cross-sectional view of section B of the reactor system depicted in FIG. 3, in which a portion of the plasma tube and a portion of the inlet conduit are shown at a point in time before the positioning of a sealing member upon the plasma tube.

FIGS. 4–9 illustrate a method for configuring reactor system 200 such that such that plasma tube 204 and inlet conduit 212 are coupled as shown in FIGS. 3 (and, in more detail, in FIG. 9) is also presented. FIG. 4 presents a cross-sectional view of section B of reactor system 200 at a point in time before the positioning of a sealing member upon the plasma tube. Section B of reactor system 200 includes parts of discharge portion 210 of plasma tube 204 and coupling portion 226 of inlet conduit 212. Plasma tube discharge portion 210 may be conceptually subdivided into a first section 220 and a central, expanded portion 222. A discharge opening 225 is defined at the end of second section 224. A gland such as sealing member groove 228 is preferably circumferentially defined (that is, it is preferably defined in and extends entirely around the circumference of) along expanded portion 222. The sealing member groove is preferably configured to receive a sealing member. First section 220 preferably has a diameter of about 25–28 mm. Expanded portion 226 may serve as a joint, and is preferably a size 35/25 ball joint.

As shown in FIG. 4, plasma tube 204 is preferably open-ended. That is, discharge portion 210 of the plasma tube preferably terminates at expanded portion 222 (e.g., the ball joint is the terminal part of discharge portion 210). Thus, the inner diameter of discharge opening 225 is preferably equal to the inner diameter of initial portion 220. Lacking a fixably attached extension such as tube extension 10, plasma tube 204 is preferably more durable than conventional plasma tubes. Alternatively, plasma tube 204 may continue beyond expanded portion 222. Any such extension, however, is preferably attached directly to expanded portion 222 and limited in length (e.g., extending less into inlet conduit 212 than a conventional tube extension).

Figure 5:
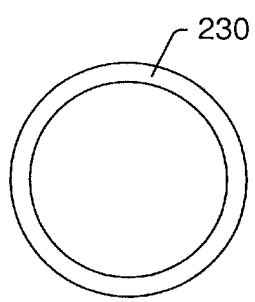
FIG. 5 is a top view of a sealing member configured for use in the reactor system depicted in FIG. 3.

FIG. 5 presents a top view of a sealing member configured for use in reactor system 200. In an embodiment, the sealing member is a seal such as sealing o-ring 230. Sealing o-ring may be a variety of sizes, but is preferably a size 121 o-ring. Sealing o-ring 230 may be subsequently at least partially arranged within sealing member groove 228. Preferably, sealing o-ring 230 is selected such that the o-ring fits securely into sealing member groove 228 but can nevertheless be installed without tremendous difficulty. Preferably, sealing o-ring 230 is toroidally shaped, but it can take other shapes depending on, for example, the shape of the plasma tube. Sealing o-ring 230 may be composed of any number of elastomeric materials, including any of the materials described as being used with sealing o-ring 130 above.

Because blocking member 232 preferably serves to greatly reduce the exposure of sealing o-ring 230 to plasma-generated reactive species during operation of reactor system 200, the materials of which the sealing o-ring 230 is composed may be selected more for their sealing qualities and/or cost than for their chemical resistivity. In an embodiment, sealing o-ring 230 may be composed of an elastomer, and may further be composed of a fluoroelastomer such as Viton®. While the sealing member may be alternately composed of perfluoroelastomers such as Kalrez® and Chemraz®, the presence of blocking member 232 can reduce the benefits of such o-rings over conventional setups. Thus, the typically increased cost of such o-rings over other, less chemically resistant elastomers, may be avoided.

Figure 6:
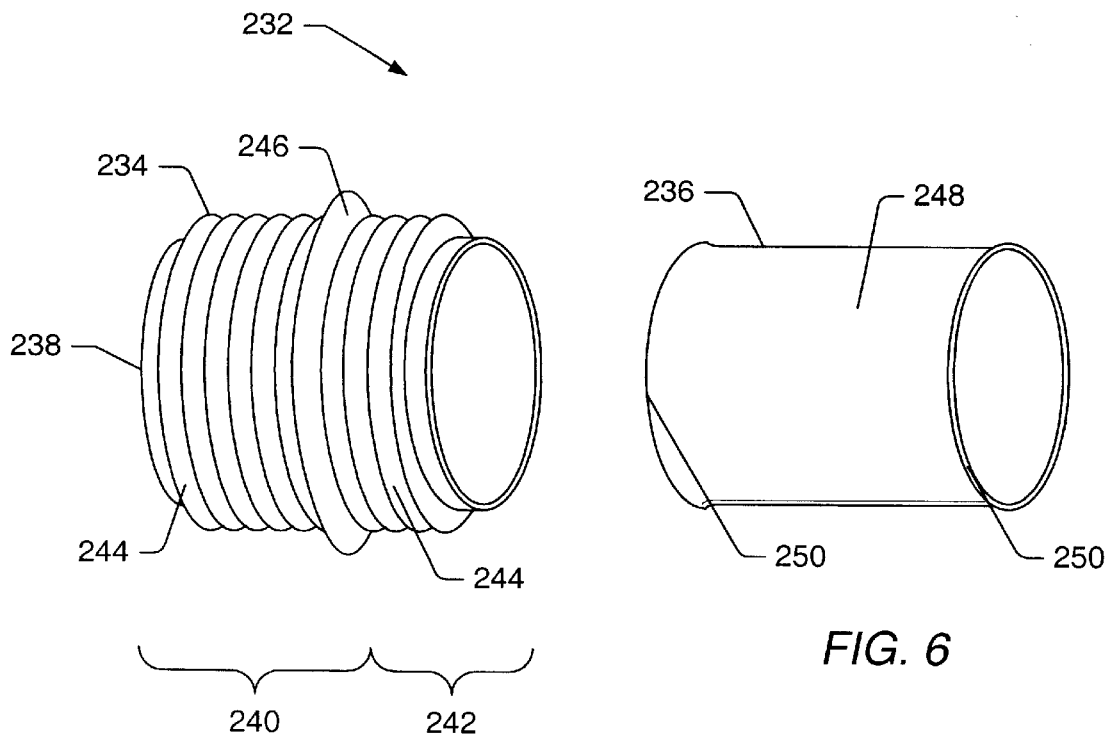
FIG. 6 is a perspective view of the plasma-resistant blocking member shown in FIG. 3, in which a plasma-resistant sleeve and a substantially chemically inert barrel of the blocking member are shown disassembled.

FIG. 6 provides a perspective view of plasma-resistant blocking member 232, shown disassembled. Blocking member 232 preferably includes plasma-resistant polymeric sleeve 234 and a chemically inert barrel 236. Blocking member 232 is preferably substantially more resistant to erosion by plasma-generated reactive species than sealing o-ring 130. It is not required that blocking member 232 be more resistant to erosion by plasma-generated reactive species under all conditions, though this may be true; it is more important that the blocking member posses this enhanced chemical resistivity under the operation conditions of the particular reactor system in which it is used.

Figure 7:
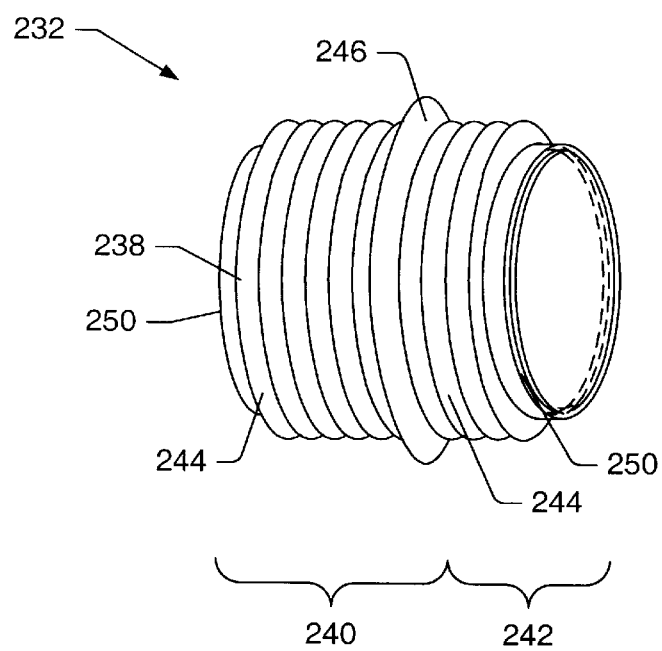
FIG. 7 is a perspective view of a plasma-resistant blocking member depicted in FIG. 6, in which the plasma-resistant sleeve is arranged around the substantially chemically inert barrel.

Sleeve 234 preferably includes body 238, ribs 244, and stop 246. As shown in FIG. 7, body 238 is preferably substantially cylindrically shaped. Body 238 may extend between a first and a second opening that are in gaseous communication (i.e., configured such that gas may travel between them). In an embodiment, the inner diameter of sleeve 234 may be less than about ⅞ in. Ribs 244 may extend from body 238, with each of ribs 244 possibly extending from body 238 by an equivalent amount. In an embodiment, ribs 244 may each extend about 1/32–1/16 of an inch from body 238. Ribs 244 preferably circumferentially defined around body 238. That is, each of ribs 244 preferably extends around the entire circumference of body 238. Ribs 244 may be spaced from each other, and more preferably are spaced equidistantly from each other. Ribs 244 are preferably somewhat flexible (i.e., they are capable of bending to at least a significant degree without breaking and/or cracking). The overall effect of ribs 244 may be to give sleeve 234 the appearance and/or function of a plunger.

Additionally, ribs 244 may facilitate the accommodation of any inconsistencies in the sizing of the plasma tube 204 and inlet conduit 212. The fabrication process for a plasma tube such as plasma tube 204 and inlet conduit such as inlet conduit 212 are usually not perfect; inconsistencies in several of the parameters of such elements may arise from the natural fabrication sequence. Thus, it is not uncommon for either plasma tube 204 or inlet conduit 212 to have an inner diameter greater or less than expected. But since ribs 244 are preferably able to be bent if their outer diameter is less than the inner diameter of either plasma tube 204 or inlet conduit 212, sleeve 234 may be effectively used with equipment having, e.g., inner diameters that vary substantially from expected values—providing greater flexibility.

As noted above, stop 246 may also extend from body 238. Stop 246 may be used to inhibit, and preferably prevent, sleeve 234 from being inserted entirely into plasma tube 204 or throat 233 of inlet conduit 212. Stop 246 preferably extends further from body 238 than ribs 244; in an embodiment, stop 246 may extend at least twice as far from body 238 as ribs 244. Stop 246 is preferably the outermost portion of sleeve 234, and is preferably circumferentially defined around body 238. In an embodiment, stop 246 may extend about 1/16–2/16 of an inch from body 238. Stop 246 preferably has an outer diameter of about 1 in.

Stop 246 is preferably located near the center of sleeve 234. In an embodiment, since stop 246 may be considered to effectively divide sleeve 234 into long section 240 and a short section 242. Long section 240 is preferably, of course, longer than short section 242. Preferably, more ribs extend from long section 240 than from short section 242 (in the embodiment shown in FIG. 6, six ribs extend from long section 240 while four ribs extend from short section 242). During operation, long section 240 is preferably inserted into plasma tube 204, and short section 242 is preferably oriented toward inlet conduit 212. Thus, when sleeve 234 is positioned partially within discharge opening 225 of plasma tube 204 and throat 233 of inlet conduit 212, sleeve 234 may extend further into plasma tube 204 that it does from plasma tube 204 into inlet conduit 212.

Sleeve 234 is preferably plasma-resistant; that is it is capable of withstanding direct exposure to plasma-generated reactive species without significant erosion for a substantial time (e.g., greater than a few hours when used in a downstream plasma stripper such as described herein). While the sleeve is preferably composed of a material that is at least plasma-resistant (e.g., has some significant resistivity to attack by plasma-generated reactive species), it is not required to be composed of a material that is totally unaffected by plasma (e.g., one that is chemically inert). Preferably, sleeve 234 is at least partially composed of a fluorocarbon polymer. More preferably, sleeve 234 is at least partially composed of one of the fluorocarbon polymers available under the trademark Teflon and commercially available from E.I. du Pont de Nemours and Company (or a material having similar properties, e.g., resistance to attack by plasma-generated reactive species). Exemplary fluorocarbon polymers include perfluoroalkoxy polymer, fluorinated ethylene propylene polymer, and polytetrafluoroethylene.

Barrel 236 preferably includes a central portion 248 extending between a pair of flared ends 250. Flared ends 250 preferably have an outer diameter greater than the inner diameter of polymeric sleeve 234. Flared ends 250 may serve to retain sleeve 234 upon and around the barrel during use, as well as to protect the ends of body 238 of sleeve 234 from plasma-induced erosion. Barrel 236 is preferably composed of a substantially chemically inert material, such as fused quartz. In any case, barrel 236 is preferably composed of a material having at least the same chemical resistivity as the material used for central portion 208 of plasma tube 204. Consequently, the barrel may be capable of withstanding direct exposure to plasma for a substantial time without fear of erosion.

FIG. 7 presents a perspective view of the plasma-resistant blocking member depicted in FIG. 6, in which sleeve 234 is arranged around barrel 236. Sleeve 234 is preferably sized such that it may be slid over and around barrel 236. Barrel 236 is preferably longer than sleeve 234 such that flared ends 250 extend beyond the respective ends of body 238. (As shown in FIG. 7, barrel 236 is preferably somewhat transparent so that at least the outline of the sleeve 234 may be seen therethrough (shown in FIG. 7 with a dotted line)). Being so assembled, sleeve 234 and barrel 236 may be considered to form a "floating" quartz seal.

Figure 8:
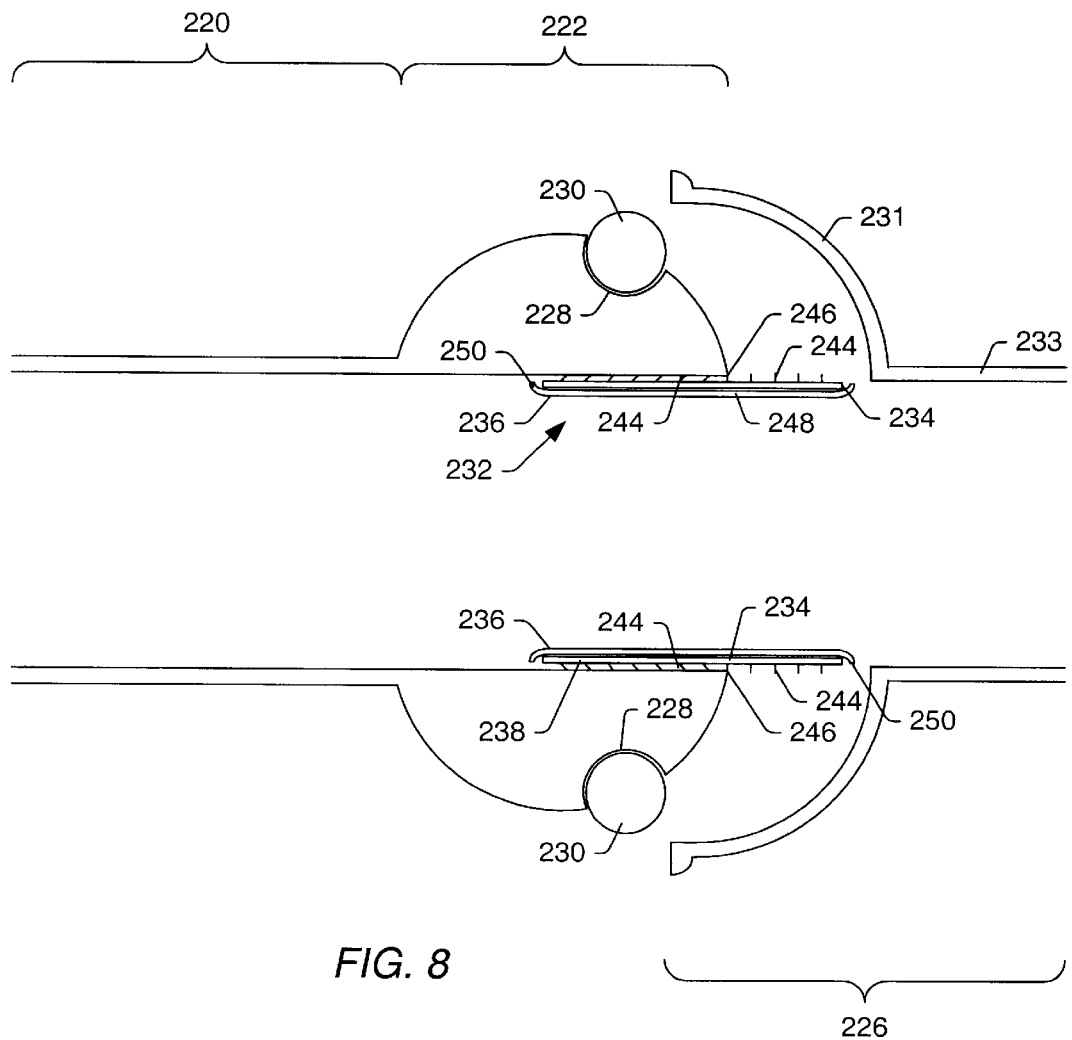
FIG. 8 is a enlarged cross-sectional view of section B of the reactor system depicted in FIG. 3, at a point in time after positioning of the sealing member and the plasma-resistant blocking member upon and within, respectively, the plasma tube.

FIG. 8 provides a enlarged cross-sectional view of section B of the reactor system depicted in FIG. 3, at a point in time after positioning of the sealing member and the plasma-resistant blocking member upon and within, respectively, the plasma tube. Plasma tube 204 may initially not have sealing o-ring 230 within sealing member groove 228. As shown in FIG. 8, sealing o-ring 230 may subsequently be positioned within sealing member groove 228 of plasma tube 204. Techniques to increase the ease of installation of the sealing member and the blocking member may be incorporated in manners that would be apparent to one of ordinary skill in the art having the benefit of the present disclosure.

As shown in FIG. 8, the inner diameter of discharge opening 225, expanded section 222, and initial section 220 is preferably less than that an outer diameter of ribs 244 on long section 240. Thus, upon insertion of blocking member 232 into discharge opening 225, ribs 244 on long section 240 may be bent towards discharge opening 225 by the more narrow inner surface of expanded section 222. However, the outer diameter of stop 246 is preferably sufficiently greater than the inner diameter of discharge opening 225 that stop 246 is inhibited, and preferably prevented, from being inserted into discharge opening 225.

Coupling section 226 of inlet conduit 212 may be brought into a position proximate to plasma tube 204 to allow for the subsequent coupling of the inlet conduit and the plasma tube. Coupling section 226 may include socket 231, preferably a size 25/35 ball joint socket. Coupling section 226 may also include a throat 233 attached to socket 231. The inner diameter of throat 233 is preferably equivalent to the inner diameter of initial section 220, and possibly to the inner diameter of expanded section 222.

Figure 9:
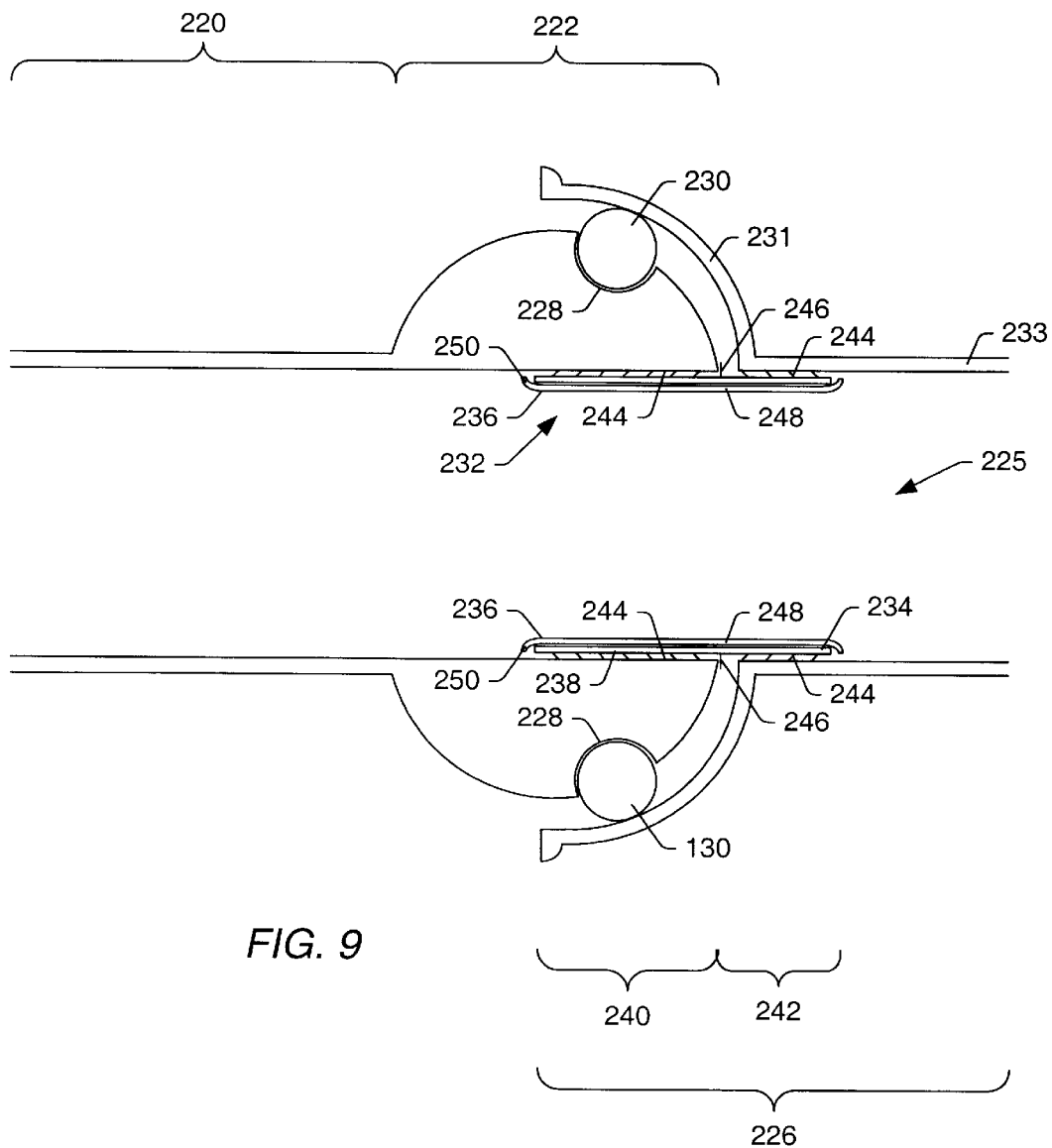
FIG. 9 is an enlarged cross-sectional view of section B of the reactor system depicted in FIG. 3, at a point in time after the coupling of the plasma tube and the inlet conduit.

FIG. 9 provides an enlarged cross-sectional view of section B of the reactor system depicted in FIG. 3 at a point in time after the coupling of plasma tube 204 and inlet conduit 212. Subsequently, discharge portion 210 may be inserted within coupling section 226 to couple the plasma tube with the inlet conduit. In the coupled configuration, both sealing o-ring 230 and blocking member 232 may contact coupling section 226. While coupling section 226 may be considered to exert lateral force upon those sealing o-ring 230 and blocking member 232, coupling section 226 preferably exerts greater lateral force on sealing o-ring 236. As such, both the blocking member and the sealing member may provide a seal between the plasma tube and the inlet conduit. FIG. 9 shows an embodiment in which the inner diameter of throat 233 is less than the outer diameter of ribs 244 on short section 242, such that these ribs are then bent by throat 233 in a direction towards plasma tube 204. Thus, ribs 244 on short portion 242 and ribs 244 on long portion 240 may be bent towards each other. As noted above, blocking member 232 is preferably not fixably attached to plasma tube 204 or tube inlet conduit 212. Thus, blocking member 232 may be capable of independent movement relative to plasma tube 204 and inlet conduit 212.

An exemplary method of operation for reactor system 200 may be illustrated by reference to FIGS. 3 and 9. During operation, vacuum pump 228 may be used to evacuate gases from reaction chamber 214 and all conduits in gaseous communication with the reaction chamber. This evacuation may be accomplished in a series of steps each having different rates of gas removal. After a suitable level of vacuum has been established, the desired gases may be introduced into plasma tube 204 from gas source 202. The desired amount and proportion of gases supplied by gas source 202 may be regulated using one or more mass flow controllers. The particular gases introduced into plasma tube 204 are chosen to generate a certain concentration and type of reactive species upon the subsequent creation of a plasma. Gas source 202 may also supply inert gases that are not intended to react with the materials in reaction chamber 214, but that do serve to improve the quality of the processes carried out therein.

As the gases enter central portion 208, they are exposed to microwaves created by plasma generating apparatus 211. The exposure of the gases to a sufficient level and quantity of microwave radiation converts the gases to at least a partially ionized plasma, which generates the reactive species desired for subsequent processing. The plasma-generated reactive species are transported into discharge portion 210, and from there they enter inlet conduit 212. From inlet conduit 212, the reactive species are transported into reactor chamber 214 for use in processing. In passing from plasma tube 204 to inlet conduit 212, the plasma preferably passes through barrel 236.

As described earlier, however, some portion of the plasma-generated reactive species leaving the plasma tube fails to immediately continue down the reactor chamber inlet conduit and is instead diverted back around towards discharge opening 225. In conventional setups that do not utilize a blocking member such as blocking member 232, a large portion of these species are able to contact the sealing member. The method, however, preferably involves, concurrent with transporting plasma from plasma tube 204 to inlet conduit 212, inhibiting plasma with blocking member 232 from passing the blocking member to contact sealing o-ring 230. In an embodiment, the blocking member includes a rib 244 extending from the blocking member to a point at least proximate to an inner surface of inlet conduit 212 such that inhibiting further involves inhibiting the flow of plasma between the rib and the conduit. Thus, a blocking member as described herein is capable of preventing a substantial portion of the plasma-generated reactive species exiting discharge opening 225 from reaching sealing o-ring 230.

It will be appreciated by those skilled in the art having the benefit of this disclosure that the present disclosure is believed to provide a downstream plasma reactor system with an improved plasma tube sealing configuration, as well as a method of configuring and operating such a reactor system. Further modifications and alternative embodiments of various aspects of the invention will be apparent to those of ordinary skill in the art in view of this description. For example, multiple blocking members could be utilized in certain designs. Further, the blocking member could include a sleeve arranged upon the outside of a portion of a plasma tube, for example, a portion such as tube extension 124. Still further, the blocking member is not required to extend into both the plasma tube and an another conduit, but may only extend into one or none of the two elements. Still further, the plasma-resistant blocking member is not required to be constructed entirely of plasma-resistant materials, but preferably at least the outermost and innermost portions of it are. Still further, the plasma-resistant blocking member may be used in any situation where plasma passes from one conduit to another conduit and a seal is used between the conduits, regardless of whether plasma is generated in the first conduit (e.g., the plasma could be generated in a device upstream of a plasma tube). Still further, the present disclosure is not intended to be limited to one model of downstream plasma reactor system; on the contrary, it is believed that, among other things, the present disclosure may apply to numerous situations in which a plasma is generated in one vessel and transported to another vessel.

It is intended that the following claims be interpreted to embrace all such modifications and changes and, accordingly, the specification and drawings are to be regarded in an illustrative rather than a restrictive sense.

What is claimed is:

1. A downstream plasma reactor system, comprising:
    a sealing member arranged between a plasma tube and an inlet conduit configured to be in gaseous communication with a reaction chamber; and
    a plasma-resistant blocking member that extends from a discharge opening of the plasma tube into the inlet conduit, and wherein the blocking member comprises a rib extending from an outer diameter of the blocking member to an inner diameter of the inlet conduit to inhibit plasma exiting the discharge opening from passing the blocking member to contact the sealing member.

2. The system of claim 1, wherein the blocking member is arranged at least partially within the discharge opening.

3. The system of claim 2, wherein the blocking member further comprises a stop extending from the blocking member further than the rib to inhibit the blocking member from being inserted entirely into the plasma tube.

4. The system of claim 2, wherein the plasma tube comprises an expanded section having a sealing member groove in which the sealing member is arranged, and wherein the discharge opening is located in the expanded section.

5. The system of claim 1, wherein rib is flexible and the outer diameter of the rib is greater than the inner diameter of the portion of the conduit such that the rib is bent by the conduit.

6. The system of claim 1, wherein the blocking member comprises a sleeve containing a polymeric material and arranged around a barrel containing a substantially chemically inert material, the sleeve and barrel each having a first opening and a second opening in gaseous communication.

7. The system of claim 6, wherein the sleeve comprises a fluorocarbon polymer selected from the group consisting of polytetrafluoroethylene, perfluoroalkoxy polymer, and fluorinated ethylene propylene polymer.

8. The system of claim 1, wherein the blocking member is not fixably attached to the plasma tube or the conduit.

9. An apparatus for inhibiting plasma-induced erosion of a sealing member arranged between a plasma tube and a conduit, comprising a plasma-resistant blocking member having a rib extending from the blocking member, the blocking member being positionable between the plasma tube and the conduit such that the flow of plasma between the rib and the conduit is inhibited.

10. The blocking member of claim 9, further comprising a stop extending from the blocking member further than the rib to inhibit the blocking member from being inserted entirely into the plasma tube.

11. The blocking member of claim 10, wherein the rib is flexible and extends around the circumference of the blocking member.

12. The blocking member of claim 11, wherein the blocking member comprises a sleeve containing a polymeric material and having a first opening and a second opening in gaseous communication.

13. The blocking member of claim 12, wherein the rib is a first rib and the stop divides the blocking member into a short section and a long section longer than the first section, and wherein the sleeve comprises a plurality of ribs including the first rib that are arranged on both the short and long sections, and wherein more of the plurality of ribs are arranged on the long section than on the short section.

14. The blocking member of claim 12, wherein the sleeve comprises a fluorocarbon polymer.

15. The blocking member of claim 14, wherein the sleeve comprises a fluorocarbon polymer selected from the group consisting of polytetrafluoroethylene, perfluoroalkoxy polymer, and fluorinated ethylene propylene polymer.

16. The blocking member of claim 14, wherein the sleeve is arranged around a barrel comprising a substantially chemically inert material.

17. The blocking member of claim 9, wherein at least a portion of an inner surface of the blocking member is substantially chemically inert.

* * * * *